US012588521B2

(12) United States Patent
Dadvand et al.

(10) Patent No.: US 12,588,521 B2
(45) Date of Patent: Mar. 24, 2026

(54) METAL NITRIDE CORE-SHELL PARTICLE DIE-ATTACH MATERIAL

(71) Applicant: Wolfspeed, Inc., Durham, NC (US)

(72) Inventors: Afshin Dadvand, Durham, NC (US); Devarajan Balaraman, Apex, NC (US)

(73) Assignee: Wolfspeed, Inc., Durham, NC (US)

( * ) Notice: Subject to any disclaimer, the term of this patent is extended or adjusted under 35 U.S.C. 154(b) by 493 days.

(21) Appl. No.: 18/169,518

(22) Filed: Feb. 15, 2023

(65) Prior Publication Data

US 2024/0282741 A1 Aug. 22, 2024

(51) Int. Cl.
*H01L 23/00* (2006.01)
*H01L 23/495* (2006.01)

(52) U.S. Cl.
CPC ........ *H01L 24/29* (2013.01); *H01L 23/49582* (2013.01); *H01L 24/32* (2013.01); (Continued)

(58) Field of Classification Search
CPC ... H01L 23/49513; H01L 24/83; H01L 24/48; H01L 24/29; H01L 24/32; H01L 23/49582; H01L 24/16; H01L 23/49827; H01L 23/49822; H01L 23/645; H01L 23/49838; H01L 23/50; H01L 23/49811; H01L 23/3736; H01L 24/73; H01L 23/5383; H01L 21/6835; H01L 2224/29847; H01L 2224/29987; H01L 2224/2979; H01L 2224/48245; H01L 2924/182; H01L 2224/32245; H01L 2224/16227; H01L 2924/19103; H01L 2224/131; H01L 2924/19042; H01L 2924/014; H01L 2924/00014; H01L 2224/29309; H01L 2224/29324; H01L 2224/29339; H01L 2224/29347; H01L 2224/48091; H01L 2221/68359; H01L 2221/68345; H01F 1/20; H01F 17/001; H01F 27/2804; H01F 1/26; H01F 17/0033; H01F 2027/2809; (Continued)

(56) References Cited

U.S. PATENT DOCUMENTS 6,548,264 B1 * 4/2003 Tan .......................... B82Y 5/00 428/404
8,581,381 B2 11/2013 Zhao et al.
(Continued)

FOREIGN PATENT DOCUMENTS

| | | |
|---|---|---|
| JP | 2008-144253 | 6/2008 |
| JP | 2016-028823 | 3/2016 |
| JP | 2018-062686 | 4/2018 |

OTHER PUBLICATIONS

Seo et al., "Comprehensive Analysis of a Cu Nitride Passivated Surface that Enhances Cu-to-Cu Bonding", IEEE Transactions on Components Packaging and Manufacturing Technology, vol. 10, No. 11, Nov. 2020, pp. 1814-1820.
(Continued)

*Primary Examiner* — Mouloucoulaye Inoussa
(74) *Attorney, Agent, or Firm* — Dority & Manning, P.A.

(57) ABSTRACT

Die attach materials are provided. In one example, the die-attach material includes a plurality of core-shell particles. Each core-shell particle includes a core and a shell on the core. The core includes a conducting material. The shell includes a metal nitride.

19 Claims, 5 Drawing Sheets

(52) U.S. Cl.
CPC ...... *H01L 24/48* (2013.01); *H01L 2224/2979* (2013.01); *H01L 2224/29847* (2013.01); *H01L 2224/29987* (2013.01); *H01L 2224/32245* (2013.01); *H01L 2224/48245* (2013.01); *H01L 2924/182* (2013.01)

(58) Field of Classification Search
CPC ... C23C 18/1633; C23C 18/1635; B22F 1/17; B22F 7/064; B22F 3/1035; B22F 1/145; B22F 1/16; B22F 2301/30; B22F 2302/20; B22F 2301/10; B22F 2302/25; C08K 3/08; B23K 35/22; C22C 1/0433; C22C 1/0466; A01N 25/26; D06M 23/12; D06M 11/58; D06M 23/08; D06M 2101/16; D06M 2101/04
See application file for complete search history.

(56) References Cited

U.S. PATENT DOCUMENTS

| | | | | |
|---|---|---|---|---|
| 11,389,865 | B2 | 7/2022 | Ghoshal et al. | |
| 11,424,177 | B2 | 8/2022 | Flowers et al. | |
| 11,488,923 | B2 | 11/2022 | Joo et al. | |
| 2013/0071971 | A1* | 3/2013 | Kajiwara | H01L 21/56 438/123 |
| 2013/0216848 | A1* | 8/2013 | Kalich | C22C 32/0021 228/248.1 |
| 2014/0332964 | A1 | 11/2014 | Yang et al. | |
| 2015/0036234 | A1* | 2/2015 | Ben-Yakar | H10N 99/05 438/69 |
| 2015/0325507 | A1* | 11/2015 | Uzoh | B23K 35/0266 257/737 |
| 2016/0108204 | A1* | 4/2016 | Joshi | B22F 1/17 524/440 |
| 2016/0111612 | A1* | 4/2016 | Yen | H10H 20/856 257/98 |
| 2016/0211425 | A1* | 7/2016 | Tsujimoto | H10H 20/81 |
| 2017/0081248 | A1* | 3/2017 | Jeong | B22F 1/00 |
| 2017/0186909 | A1* | 6/2017 | Kim | H10K 50/11 |
| 2017/0338169 | A1* | 11/2017 | Mahler | H01L 23/3142 |
| 2018/0254488 | A1* | 9/2018 | Di Noto | H01M 4/8673 |
| 2019/0194453 | A1* | 6/2019 | Liu | B32B 27/285 |
| 2019/0221343 | A1* | 7/2019 | Chen | B22F 1/054 |
| 2019/0252102 | A1* | 8/2019 | Marin | H01F 17/0033 |
| 2020/0132394 | A1* | 4/2020 | Joshi | C09K 5/02 |
| 2020/0199736 | A1* | 6/2020 | Yuan | C23C 14/14 |
| 2020/0244164 | A1 | 7/2020 | Das et al. | |
| 2020/0350480 | A1* | 11/2020 | Marutani | H10H 20/80 |
| 2021/0098354 | A1* | 4/2021 | Wu | H01L 23/5385 |
| 2021/0225860 | A1 | 7/2021 | Ishihara | |
| 2021/0381110 | A1* | 12/2021 | Joshi | C23C 18/1633 |
| 2022/0005638 | A1* | 1/2022 | Marin | H01F 1/20 |
| 2022/0139852 | A1 | 5/2022 | Pun | |
| 2022/0153055 | A1* | 5/2022 | Kim | H01F 1/047 |
| 2022/0230984 | A1* | 7/2022 | Liu | B22F 1/052 |
| 2023/0083154 | A1* | 3/2023 | Check | H10H 20/854 356/369 |
| 2023/0117153 | A1* | 4/2023 | Lee | B23K 35/262 228/56.3 |
| 2024/0182757 | A1* | 6/2024 | Dadvand | C09J 11/04 |
| 2025/0214181 | A1* | 7/2025 | Won | H01L 24/11 |

OTHER PUBLICATIONS

International Search Report and Written Opinion for Application No. PCT/US2024/015680, mailed Jun. 24, 2024.

* cited by examiner

200

Depositing a Die-Attach Material on a Substrate — 202

Providing a Semiconductor Die or Other Component on the Die-Attach Material — 204

Bonding the Die-Attach Material (e.g., Sintering, Reflow, Annealing, Curing, Exposing to a Laser, Exposing to Pulsed Light, Exposing to UV Light) — 206

METAL NITRIDE CORE-SHELL PARTICLE DIE-ATTACH MATERIAL

FIELD

The present disclosure relates generally to die-attach materials.

BACKGROUND

Semiconductor devices, including power semiconductor devices based on wide band gap materials, may be formed on a semiconductor wafer as part of a semiconductor fabrication process. The semiconductor wafer may be diced into many individual pieces, each containing one or more semiconductor devices. Each of these pieces may be a semiconductor die. The semiconductor die may need to be attached to other components as part of packaging of the semiconductor device. For instance, a semiconductor die, such as a wide band gap semiconductor die, may need to be attached to a conductive lead frame for use in a discrete power semiconductor package or a power module. Materials used to attach the semiconductor die to other components may need to provide a thermal, mechanical, and/or electrical connection of the semiconductor die to the other components.

SUMMARY

Aspects and advantages of embodiments of the present disclosure will be set forth in part in the following description, or may be learned from the description, or may be learned through practice of the embodiments.

One example embodiment of the present disclosure is directed to a die-attach material. The die-attach material includes a plurality of core-shell particles. Each core-shell particle comprising a core and a shell on the core. The core comprises a conducting material. The shell comprises a metal nitride.

Another example embodiment of the present disclosure is directed to die-attach material. The die-attach material includes a plurality of core-shell particles. Each core-shell particle comprising a core and a shell on the core. The core comprises copper and the shell comprises copper nitride. The die-attach material may be an ink or a paste.

Another example embodiment of the present disclosure is directed to a device. The device includes a semiconductor die comprising a wide band gap semiconductor material. The device includes a substrate. The device includes a die-attach material between the semiconductor die and the substrate. The die-attach material includes a plurality of bonded conductive particles and a metal nitride.

Another example embodiment of the present disclosure is directed to a device. The device includes a substrate. The device includes a sintered material on the substrate. The sintered material comprises a plurality of bonded copper particles and a copper nitride.

Another example embodiment of the present disclosure is directed to a method. The method includes depositing a die-attach material on a substrate, the die-attach material comprising a plurality of core-shell particles, each core-shell particle comprising a core and a shell on the core, wherein the core comprises a conducting material and the shell comprises a metal nitride. The method includes bonding the die-attach material.

Another example embodiment of the present disclosure is directed to a method. The method includes oxidizing a plurality of conductive particles to form a plurality of oxidized conductive particles. The method includes adding the oxidized conductive particles to a solution to form a metal nitride shell on the conductive particles, the solution comprising a compound, the compound comprising hydrogen and nitrogen.

These and other features, aspects and advantages of various embodiments will become better understood with reference to the following description and appended claims. The accompanying drawings, which are incorporated in and constitute a part of this specification, illustrate embodiments of the present disclosure and, together with the description, explain the related principles.

BRIEF DESCRIPTION OF THE DRAWINGS

Detailed discussion of embodiments directed to one of ordinary skill in the art are set forth in the specification, which refers to the appended figures, in which.

DETAILED DESCRIPTION

Figure 1:
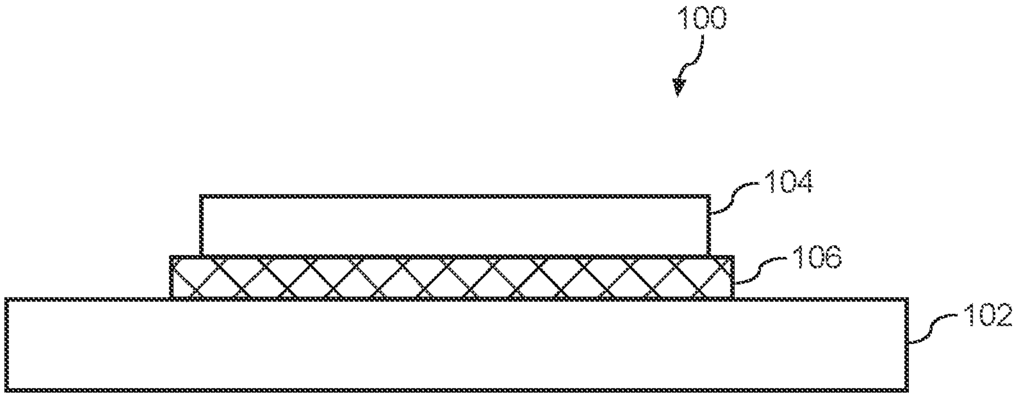
FIG. 1 depicts an example device with a semiconductor die attached to a substrate using a die-attach material according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations may be made to the embodiments without departing from the scope or spirit of the present disclosure. For instance, features illustrated or described as part of one embodiment may be used with another embodiment to yield a still further embodiment. Thus, it is intended that aspects of the present disclosure cover such modifications and variations.

Example aspects of the present disclosure are directed to die-attach materials for use in semiconductor applications and other electronics applications, such as wide band gap semiconductor device applications. Various technologies that are practiced in the semiconductor industry for die-attach present challenges and limitations. For example, semi-silver or full-silver sintering process techniques offer acceptable electrical, mechanical and thermal properties for die-attach applications. However, semi-silver or full-silver sintering process techniques may have a high cost and also may be at high risk of electromigration, high voiding/porosity, and high thermo-mechanical stresses. Eutectic Au80Sn20 techniques may also pose similar limitations. Semi-sintered or full-sintered copper is a lower cost option with somewhat lower performance due the high oxidation susceptibility of copper especially in small particle sizes. Semi-sintered or full sintered copper may also pose challenges in requiring low temperature storage and a forming gas during a deposition process to reduce oxidation. Lead (Pb) based die-attach solutions are not optimal options for achieving low thermal resistance and efficient current or power density. In addition, lead (Pb) based die-attach materials do not meet certain lead-free certification standards.

Example aspects of the present disclosure are directed to a core-shell particle-based die-attach material. The die-attach material may include a paste-based or ink-based material including a plurality of metal core-shell microparticles and/or metal core-shell nanoparticles dispersed in a solution or grafted to a polymer matrix. The structure of the core-shell particles may include a core of a conducting material (e.g., electrically conducting material), such as copper (Cu). A shell may be on the core. The shell may include a metal nitride, such as copper nitride ($Cu_3N$). The metal nitride may reduce oxidation of the core relative to copper particles.

During bonding of the die-attach material (e.g., sintering of the die-attach material), the metal nitride may decompose into a metal and a nitrogen gas. Some of the metal nitride may remain in the bonded die-attach material. For instance, the metal nitride may be interspersed between bonded conductive particles in the bonded die-attach material.

Aspects of the present disclosure are discussed with reference to a die-attach material for attaching a semiconductor die (e.g., a silicon carbide-based semiconductor die, Group III nitride-based semiconductor die, silicon-based semiconductor die, etc.) to a substrate or other component for purposes of illustration and discussion. Those of ordinary skill in the art, using the disclosures provided herein, will understand that the materials provided herein may be used to provide attachment of any suitable components without deviating from the scope of the present disclosure. In this regard, the term "die-attach material" in the disclosure and claims is intended to refer to any material that is used to provide thermal, electrical, and/or mechanical connection between two components.

The die-attach material may be deposited on a substrate. A semiconductor die or other component may be placed on the die-attach material. The die-attach material may be subjected to bonding or a bonding process (e.g., sintering) to secure the semiconductor die or other component to the die-attach material. As used herein, the term "bonding" or "bonding process" refers to causing a transition of a material from a first form to a second form. A bonding process may or may not require attaching a component to the material. Sintering, reflow, annealing, curing, exposing to light, and exposing to ultraviolet light are examples of bonding processes and are encompassed by the term "bonding" or "bonding process" in the disclosure and in the claims.

In some examples, the core-shell particles may be dispersed in a solution to form the die-attach material as an ink or a paste. For instance, in some embodiments, the core-shell particles may be dispersed in ethylene glycol. In some embodiments, the core-shell particles may be grafted to a polymer matrix to form the die-attach material as an ink or a paste.

In some embodiments, the core-shell particles of the die-attach material may be formed by oxidizing conductive core particles, such as copper particles. The oxidized conductive particles may be added to a solution to form a metal nitride shell on each of the conductive particles. The solution may include a compound. The compound may include hydrogen and nitrogen. For instance, the compound may include ammonia ($NH_3$) and/or urea ($H_2NCONH_2$). The solution may further include methanol ($CH_3OH$). The solution with the oxidized conductive particles may be heated (e.g., heated in an autoclave) to form the core-shell particles. The core-shell particles may be dispersed in a solution (e.g., ethylene glycol) or grafted to a polymer matrix to form an ink or a paste.

Aspects of the present disclosure provide a number of technical effects and benefits. For instance, a die-attach material including core-shell particles with a metal nitride shell may offer enhanced aging stability, lower defects and voids, lower annealing temperature and lower pressure as well as higher thermomechanical, and electrical properties compared to die attach materials based solely on, for instance, copper particles. In examples where the core-shell particles include a copper core with a copper nitride shell, the copper core particles may be protected against oxidation by the copper nitride shell. The die-attach material may require a relatively low annealing temperature and a relatively low pressure during the bonding process (e.g., relative to a die-attach material based solely on copper particles). In addition, the bonding process can be potentially carried out without flow of forming gas. The die-attach material is lead free and may meet certain lead-free certification standards.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the disclosure are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Similarly, it will be understood that variations in the dimensions are to be expected based on standard deviations in manufacturing procedures. As used herein, "approximately" or "about" includes values within 10% of the nominal value.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Some embodiments of the invention are described with reference to semiconductor layers and/or regions which are characterized as having a conductivity type such as n type or p type, which refers to the majority carrier concentration in the layer and/or region. Thus, N type material has a majority equilibrium concentration of negatively charged electrons, while P type material has a majority equilibrium concentration of positively charged holes. Some material may be designated with a "+" or "−" (as in N+, N−, P+, P−, N++, N−−, P++, P−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments and, although specific terms are employed, they are used in a generic and descriptive sense only and not for purposes of limitation of the scope set forth in the following claims.

With reference now to the Figures, example embodiments of the present disclosure will now be set forth.

FIG. 1 depicts a cross-sectional view of a semiconductor device 100 according to example embodiments of the present disclosure. The semiconductor device 100 may include a substrate 102. The substrate 102 may be, for instance, a lead frame or other supporting structure of a wide band gap power semiconductor device, such as a silicon carbide-based semiconductor power module or discrete package. The substrate 102 may be, for instance, a copper substrate 102 or may include other suitable conducting material(s).

The semiconductor device 100 may include a semiconductor die 104. The semiconductor die 104 may include one or more devices, such as one or more of a wide variety of power devices available for different applications including, for example, power switching devices and/or power amplifiers. In some examples, the semiconductor die 104 may include one or more transistor devices, such as field effect transistors (FETs) devices, including MOSFETs (metal-oxide semiconductor field-effect transistors), DMOS (double-diffused metal-oxide semiconductor) transistors, HEMTs (high electron mobility transistors), MESFETs (metal-semiconductor field-effect transistors), LDMOS (laterally diffused metal-oxide semiconductor) transistor devices, etc. In some embodiments, the semiconductor die 104 may include one or more diodes (e.g., Schottky diodes, light emitting diodes, etc.).

In some embodiments, the semiconductor die 104 may be fabricated from wide band gap semiconductor materials (e.g., having a band gap greater than 1.40 eV). For high power, high temperature, and/or high frequency applications, devices formed in wide band gap semiconductor materials such as silicon carbide (e.g., 2.996 eV band gap for alpha silicon carbide at room temperature) and the Group III-nitrides (e.g., 3.36 eV band gap for gallium nitride at room temperature) may provide higher electric field breakdown strengths and higher electron saturation velocities.

Aspects of the present disclosure are discussed with reference to wide band gap semiconductors for purposes of illustration and discussion. Those of ordinary skill in the art, using the disclosures provided herein, will understand that the die-attach materials according to example embodiments of the present disclosure may be used with any semiconductor material or other material without deviating from the scope of the present disclosure.

The semiconductor die 104 may be attached to the substrate 102 using a die-attach material 106. The die-attach material 106 may include a plurality of core-shell particles. The particles may be nucleocapsid particles. Nucleocapsid particles refers to particles having a core (e.g., nucleus) that is encompassed by shell material. The die-attach material 106 may be subjected to a bonding process to mechanically, thermally, and/or electrically connect the semiconductor die 104 to the substrate 102.

Figure 2:
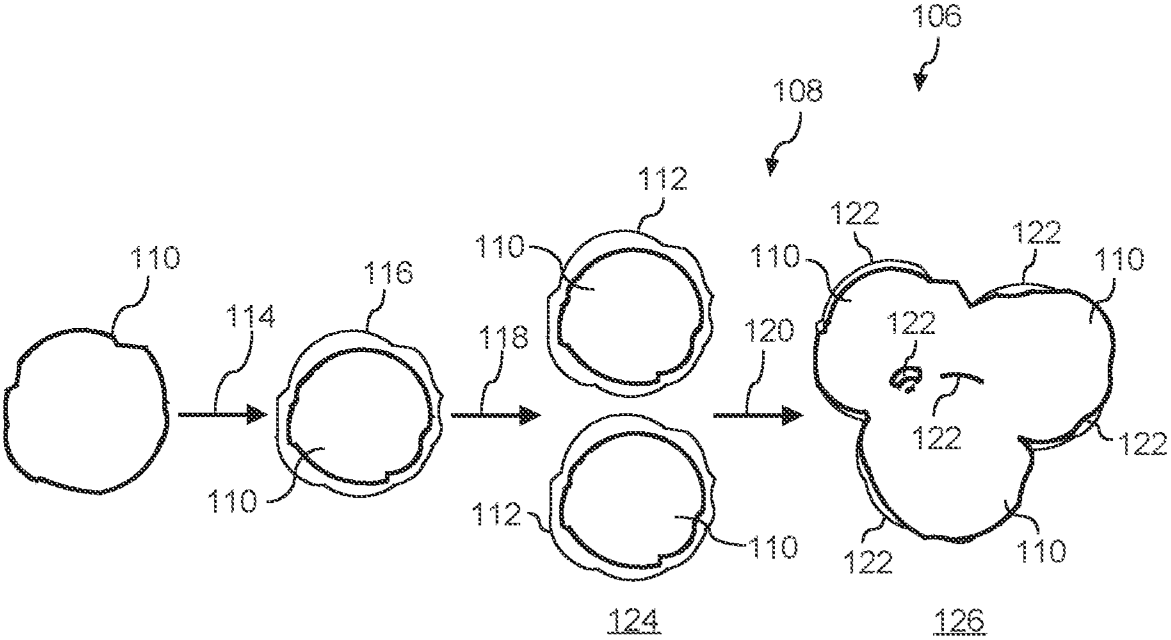
FIG. 2 depicts core-shell particles of a die-attach material according to example embodiments of the present disclosure.

FIG. 2 depicts aspects of the die-attach material 106 according to example embodiments of the present disclosure. The die-attach material 106 may include a plurality of core-shell particles 108. Each core-shell particle 108 may include a conductive particle core 110 and a shell 112 on the core 110. The core 110 may be a conducting material (e.g., an electrically conducting material). In some examples, the core 110 may include a metal, such as copper (Cu). The shell 112 may include a metal nitride, such as copper nitride ($Cu_3N$).

In some embodiments, the core-shell particles 108 may be nanoparticles. For instance, the core 110 of each of the core-shell particles 108 may have a size of less than about 1 μm. In some embodiments, the core-shell particles 108 may be microparticles. For instance, the core 110 of each of the core-shell particles 108 may have a size in a range of 1 μm to about 50 μm. In some examples, the shell 112 may have a thickness in a range of about 50 nm to about 100 nm.

In some example, as will be discussed in more detail with reference to FIG. 7 below, the core-shell particles 108 may be formed by subjecting conductive particle cores 110 (e.g., copper particles) to an oxidation process 114 to form an oxide shell 116 (e.g., copper oxide ($Cu_2O$, CuO)) on each of the cores 110. The oxidation process 114 may include, for instance, immersion in an NaOH solution, use of a plasma-based oxidation process, exposure to oxygen, etc. The oxidized cores 110 with oxide shell 116 may be subjected to a process 118 that forms the metal nitride shell 112 in place of the oxide shell 116. For instance, the cores 110 with oxide shell 116 may be mixed with a solution containing a compound. The compound may include hydrogen and nitrogen. For instance, the compound may include ammonia ($NH_3$) and/or urea ($H_2NCONH_2$). The solution may further include methanol ($CH_3OH$). The solution with the oxidized conductive particles cores may be heated (e.g., heated in an autoclave) to form the core-shell particles 108.

In some examples, the core-shell particles 108 may be dispersed in a solvent or other media to provide a die-attach material 106 that has a form of an ink or a paste prior to bonding. The solvent may be, for instance, ethylene glycol. In some examples, the core-shell particles 108 may be mixed with or grafted to a polymer matrix to form an ink or a paste prior to bonding. The conductive ink or conductive paste may be deposited (e.g., deposited on substrate 102 of FIG. 1), using inkjet, dispense, screen printer, flexo printer, gravure printer, spin coater, blade coater, spray coater, or other deposition technique(s). The die-attach material 106 may be subjected to a bonding process to transition the die-attach material 106 from a first form 124 to a second form 126.

FIG. 2 depicts the transition of die-attach material 106 from a first form 124 to a second form 126 as a result of bonding 120 of the die-attach material 106. The bonding 120 may include sintering, reflow, annealing, curing, exposure to light, exposure to ultraviolet light, exposure to a laser, exposure to pulsed light, or other suitable process to transition the form of the die-attach material 106. In the example of FIG. 2, the bonding 120 may include sintering to form a sintered material.

As shown in FIG. 2, after bonding 120, the conductive particle cores 110 may be bonded together to form bonded conductive particle cores 110. The metal nitride shell 112 may be decomposed into a metal (e.g., copper) and a nitrogen gas. A portion of the metal nitride 122 may remain in the die-attach material 106. For instance, a portion of the metal nitride 122 may be interspersed between some of the bonded conductive particle cores 110.

Figure 3:
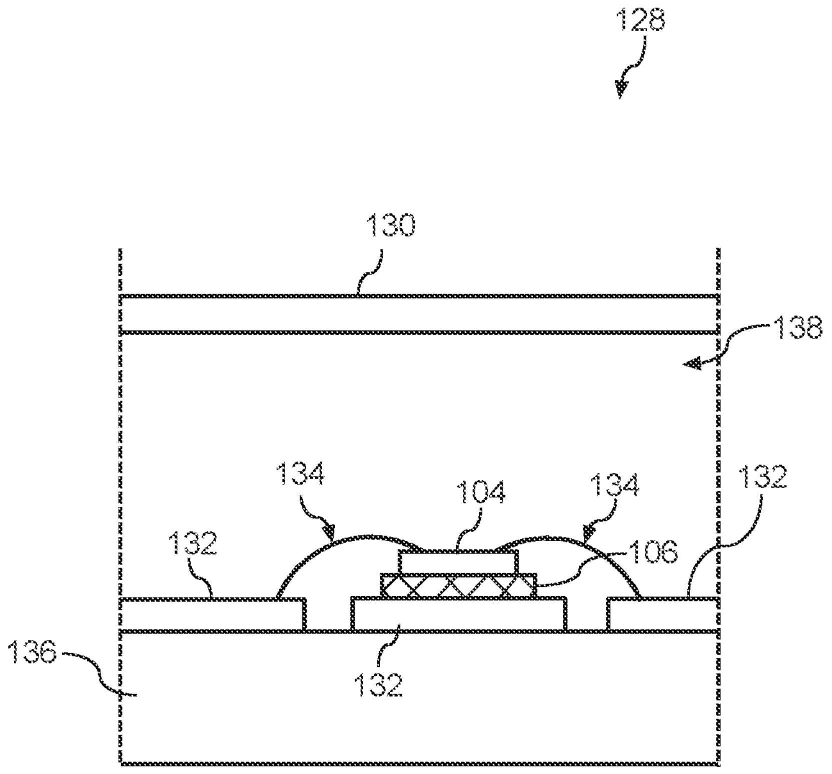
FIG. 3 depicts an example semiconductor device according to example embodiments of the present disclosure.
Figure 4:
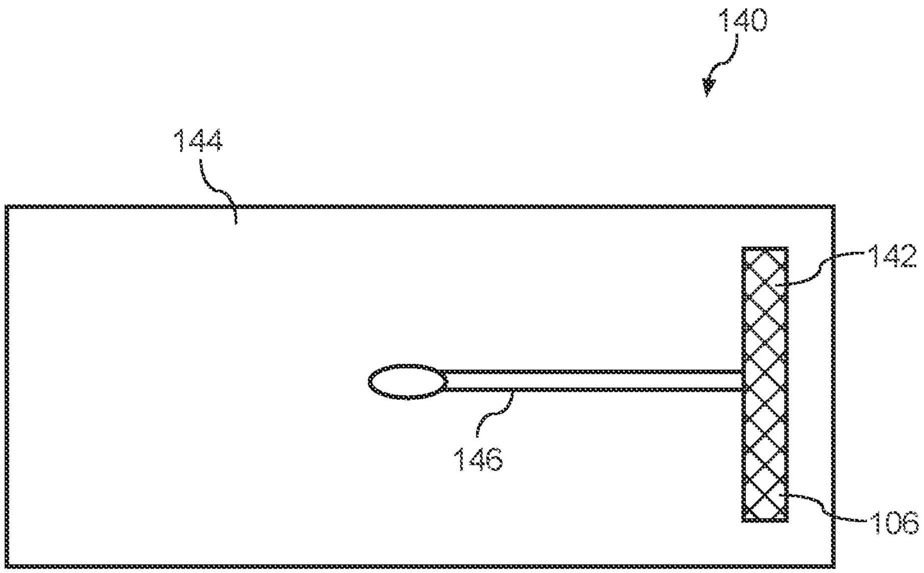
FIG. 4 depicts an example device using a die-attach material to form an antenna according to example embodiments of the present disclosure.
Figure 5:
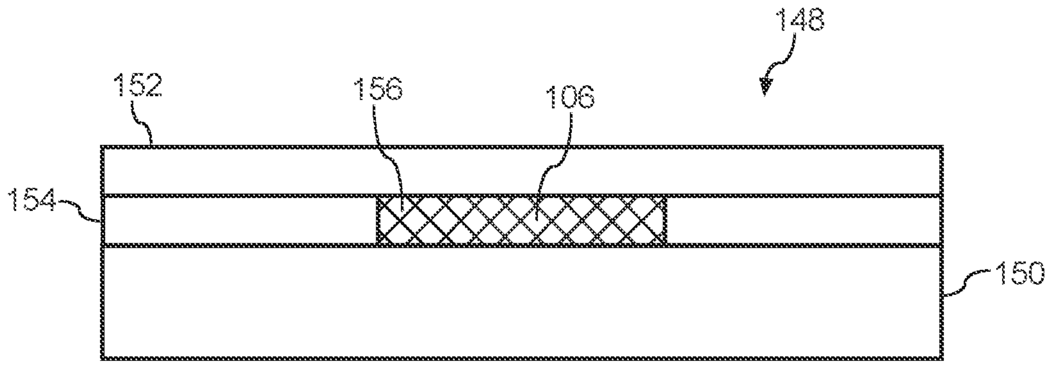
FIG. 5 depicts an example device using a die-attach material to form an interconnect according to example embodiments of the present disclosure.

FIGS. 3-5 depict example devices including a die-attach material according to example embodiments of the present disclosure. FIGS. 3-5 are provided for purposes of illustration and discussion. Those of ordinary skill in the art, using the disclosures provided herein, will understand that the die-attach material may be used in a variety of devices and/or applications without deviating from the scope of the present disclosure.

FIG. 3 depicts a cross-sectional view of a portion of a power module 128 according to example embodiments of the present disclosure. FIG. 3 is intended to represent structures for identification and description and is not intended to represent the structures to physical scale. The power module 128 may include a housing 130. The power module 128 may include a conductive substrate 132 (e.g., a patterned conductive substrate) on which a semiconductor die 104 containing one or more power devices (e.g., transistors, diodes, etc.) is attached using the die-attach material 106 according to example embodiments of the present disclosure. The die-attach material 106 may provide a thermal, mechanical, and electrical connection between the semiconductor die 104 and the conductive substrate 132. In some embodiments, the semiconductor die 104 may also be connected to the conductive substrate 132 using wire bonds 134. The conductive substrates 132 may be mounted on a base layer 136 (e.g., an insulating layer). An inert gel 138 may fill the space between the semiconductor die 104 and the housing 130.

FIG. 4 depicts a device 140 incorporating a die-attach material to form an antenna 142 for the device 140 according to example embodiments of the present disclosure. More particularly, the device 140 may include a substrate 144, such as a dielectric substrate 144. The dielectric substrate 144 may have one or more conductive elements 146, such as one or more circuit traces forming a transmission line and/or a mounting connection for the antenna 142. The die-attach material 106 may be deposited on the substrate 144 using inkjet, screen printer, flexo printer, gravure printer, spin coater, blade coater, spray coater, or other deposition technique(s). The die-attach material 106 may be subjected to a bonding process to form the antenna 142 on the substrate 144.

FIG. 5 depicts a cross-sectional view of at least a portion of a device 148 incorporating a die-attach material 106 to form an interconnect for the device 148 according to example embodiments of the present disclosure. FIG. 5 is intended to represent structures for identification and description and is not intended to represent the structures to physical scale. The device 148 may include a first layer 150 having one or more conductive portions or other portions requiring a thermal and/or electrical connection. The device 148 may include a second layer 152 that is spaced apart from the first layer 150. The second layer 152 may have one or more conductive portions or other portions requiring a thermal and/or electrical connection. The device 148 may include a third layer 154 (e.g., an insulating layer) disposed between the first layer 150 and the second layer 154. The insulating layer 154 may be patterned. The die-attach material 106 may be deposited in or on the insulating layer (e.g., in one or more voids in a patterned insulating layer 154) and subjected to a bonding process to form an interconnect 156 for the device 148. The interconnect 156 may electrically and/or thermally connect one or more portions of the first layer 150 with one or more portions of the second layer 152.

Figure 6:
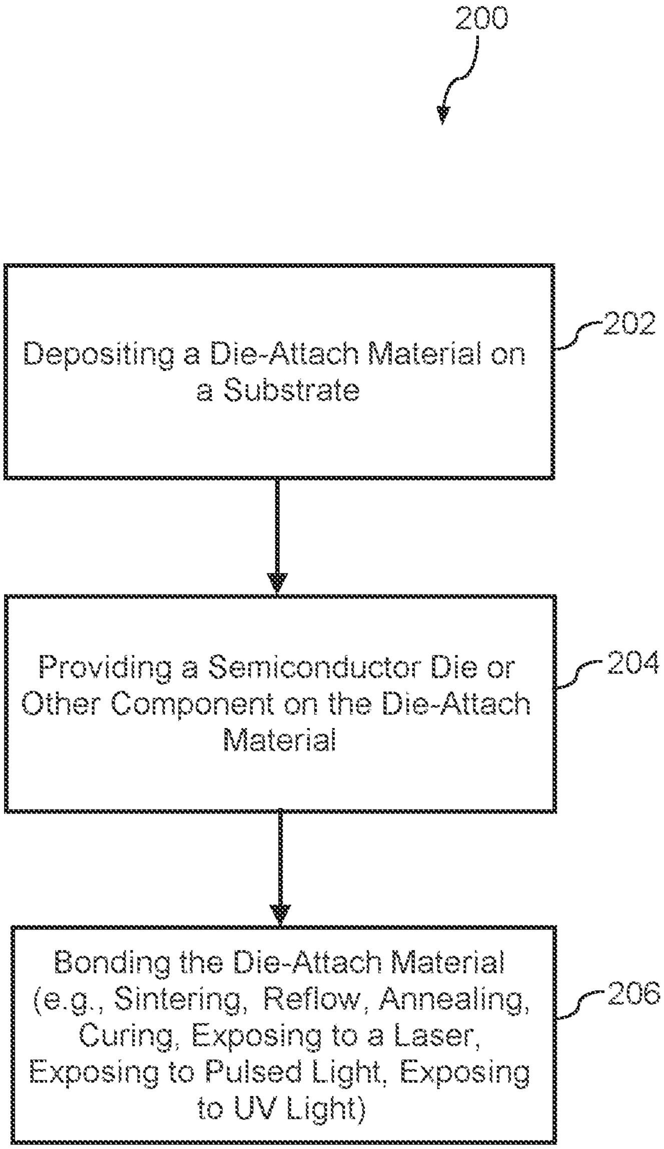
FIG. 6 depicts a flow chart of an example method according to example embodiments of the present disclosure.

FIG. 6 depicts a flow chart of an example method 200 according to example embodiments of the present disclosure. FIG. 6 depicts example method steps for purposes of illustration and discussion. Those of ordinary skill in the art, using the disclosures provided herein, will understand that the methods described in the present disclosure may be adapted, modified, include steps not illustrated, omitted, and/or rearranged without deviating from the scope of the present disclosure.

At 202, the method may include depositing a die-attach material on a substrate. The die-attach material may be any of the example die-attach materials discussed herein. For instance, the die-attach material may be the die-attach material 106 discussed with reference to FIGS. 1 and 2. In some embodiments, the die-attach material may be deposited on the substrate using inkjet, screen printer, flexo printer, gravure printer, spin coater, blade coater, spray coater, or other deposition technique(s).

At 204, the method may include providing a semiconductor die or other component on the die-attach material. In some examples, the semiconductor die may include a wide band gap semiconductor die. For instance, the semiconductor die may include a silicon carbide-based semiconductor and/or a Group III nitride-based semiconductor. The semiconductor die may include one or more devices, such as one or more transistors, one or more diodes, or other devices.

At 206, the method may include bonding the die-attach material to attach the semiconductor die to the substrate. Bonding may include subjecting the die-attach material to any bonding process, such as sintering, reflow, annealing, curing, exposing to a laser, exposing to pulsed light, exposure to ultraviolet radiation, or other process.

In one example, bonding may include sintering the die-attach material by exposing the die-attach material to heat and/or pressure. For instance, sintering the die-attach material may include heating the die-attach material to a temperature in a range of about 100° C. to about 400° C., such as about 150° C. to about 300° C., for about 30 min to about 120 min. The temperature may be selected so as not to liquefy or cause reflow of the die-attach material. Sintering the die-attach material may also include subjecting the die-attach material to pressure by applying a force onto the semiconductor die. The force may be applied by applying a flat punch or other tool to the semiconductor die. The pressure may be in a range of 1 MPa to about 30 MPa, such as about 5 MPa to about 25 MPa, such as about 10 MPa to about 20 MPa. The pressure may be applied to a time period in a range of about 1 minute to about 15 minutes. The sintering process parameters provided in the disclosure are for example purposes. Other sintering process parameters may be used without deviating from the scope of the present disclosure.

Other example bonding processes may be performed on the die-attach material without deviating from the scope of the present disclosure. For instance, in some embodiments, the die-attach material may be exposed to a laser. In some embodiments, the die-attach material may be subjected to a reflow process. In some embodiments, the die-attach material may be exposed to high intensity pulsed light. In some embodiments, the die-attach material may be exposed to ultraviolet light.

During the bonding process, the metal nitride may be decomposed into a metal and nitrogen gas. For instance, in the example of copper core particles with copper nitride shell, the copper nitride may decompose as following during bonding:

$$2Cu_3N \longrightarrow 6Cu + N_2$$

Figure 7:
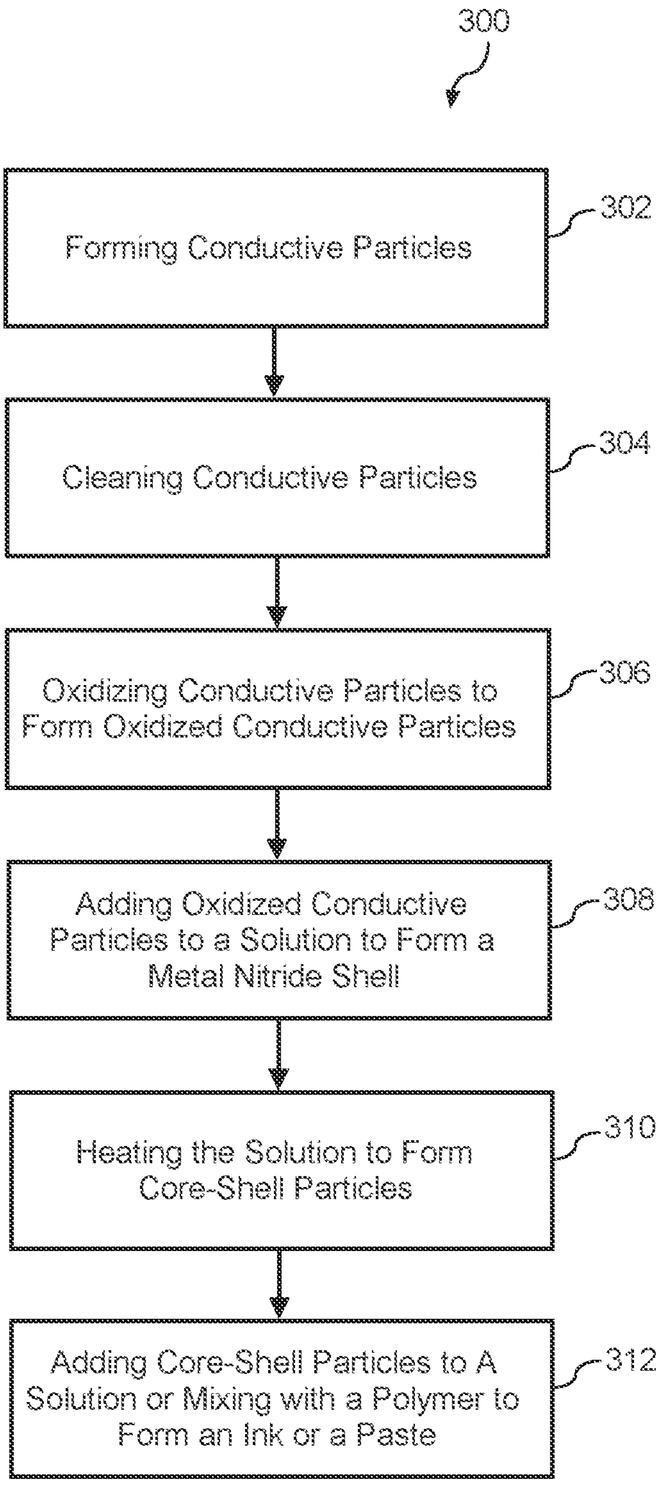
FIG. 7 depicts a flow chart of an example method according to example embodiments of the present disclosure.

FIG. 7 depicts a flow diagram of an example method 300 of forming the core-shell particles of the die-attach material according to example embodiments of the present disclosure. FIG. 7 depicts example method steps for purposes of illustration and discussion. Those of ordinary skill in the art, using the disclosures provided herein, will understand that the methods described in the present disclosure may be adapted, modified, include steps not illustrated, omitted, and/or rearranged without deviating from the scope of the present disclosure.

Referring to FIG. 7 at 302, the method 300 may include forming conductive particles 302. The conductive particles will serve as the core of the core-shell particles of the die-attach material. The conductive particles can be formed, for instance, from copper. Various different methods may be used for forming the conductive particles without deviating from the scope of the present disclosure. In some examples, the conductive particles are dendritic copper particles. In some examples, the conductive particles may be formed by mixing a core precursor (e.g., copper precursor) with a reducing agent and a stabilizer.

An example core precursor may include, for instance, one or more of copper sulfate ($CuSO_4$), copper nitrate ($Cu(NO_3)_2$), copper chloride ($CuCl_2$), copper acetate ($Cu(CO_2CH_3)_2$), nickel acetate ($Ni(CH_3CO_2)_2$), nickel sulfate ($NiSO_4$), etc. An example stabilizer may include one or more of: polyvinylpyrrolidone (PVP), cetyltrimethylammonium-bromide (CTAB), ethylenediamin (EDA), dimethylhydentoine (DMH), citric acid $HOC(CO_2H)(CH_2CO_2H)_2$, etc. An example reducing agent may include ethylene glycol (EG), sodium borohydride ($NaBH_4$), Monosodium phosphate ($NaH_2PO_4$), glucose ($C_6H_{12}O_6$), dimethylamine-borane (DMAB), ascorbic acid ($C_6H_8O_6$), and PVP, etc.

At 304, the method 300 may include cleaning the conductive particles. For instance, a solution containing the conductive particles may be rinsed, for instance, with ethanol and/or deionized water and filtered.

At 306, the method 300 may include oxidizing the conductive particles to form oxidized conductive particles. The oxidized conductive particles may include an oxide shell (e.g., $Cu_2O$ or CuO shell). The conductive particles may be oxidized in a variety of manners without deviating from the scope of the present disclosure. For instance, the conductive particles may be oxidized by immersion in an NaOH solution, use of a plasma-based oxygenation process, exposure to oxygen, etc.

At 308, the method may include adding the oxidized conductive particles to a solution to form the metal nitride shell, such as a copper nitride ($Cu_3N$) shell. The solution may contain a compound. The compound may include hydrogen and nitrogen. For instance, the compound may include ammonia ($NH_3$) and/or urea ($H_2NCONH_2$). The solution may further include methanol ($CH_3OH$).

At 310, the method 300 may include heating the solution with the oxidized conductive particles to form the core-shell particles. In some examples, the solution may be heated to a temperature in a range of about 180° C. to about 250° C. In some examples, the solution may be heated for a process period in a range of about 1 hour to about 6 hours. The core-shell particles may be rinsed (e.g., with ethanol and/or deionized water) and filtered.

At 312, the method 300 may include adding the core-shell particles to a solution to form an ink or a paste. For instance, the method 300 may include adding the core-shell particles to a solution including ethylene glycol. The method 300 may include at 312 mixing the core-shell particles with a polymer to form an ink or a paste.

A specific example of forming the die-attach material according to the example embodiment of FIG. 7 is provided below:

EXAMPLE

Copper particles were obtained by the reduction of $CuSO_4$ (0.1 M) in a solution of $NaH_2PO_4$ as reducing agent and citric acid as stabilizer at a temperature in a range of about 120° C. to about 150° C. and pH of about 5.5 to about 6.5 and stirred for a process period in a range of about 30 minutes to about 60 minutes. The solution was then rinsed (e.g., ethanol/deionized water) and filtered. The surfaces of the copper particles were oxidized through immersion in NaOH solution (0.1-1 M) at elevated temperatures to form copper particles with a copper oxide shell. Afterwards, the oxidized particles were added to a solution of liquid ammonia $NH_3$ and methanol $CH_3OH$ and heated in an autoclave at high temperature in a range from about 180° C. to about 250° ° C. for a process period of about 1 hour to about 6 hours to produce core-shell particles with a copper core and a copper nitride shell. The replacement of the oxide shell with the copper nitride shell may be represented as follows:

$$3Cu_2O + 2NH_3 \longrightarrow 2Cu_3N + 3H_2O$$

The final product was then rinsed (e.g., ethanol/deionized water), filtered and functionalized, then dispersed in a solvent or mixed/grafted with a polymer to make an ink or a paste.

Example aspects of the present disclosure are set forth below. Any of the below features or examples may be used in combination with any of the embodiments or features provided in the present disclosure.

One example embodiment of the present disclosure is directed to a die-attach material. The die-attach material includes a plurality of core-shell particles. Each core-shell particle comprising a core and a shell on the core. The core comprises a conducting material. The shell comprises a metal nitride.

In some examples, the metal nitride reduces oxidation of the core.

In some examples, the die-attach material is an ink. In some examples, the die-attach material is a paste.

In some examples, the metal nitride decomposes into a metal and a nitrogen gas during bonding of the die-attach material.

In some examples, the conducting material of the core comprises copper. In some examples, the metal nitride comprises copper nitride.

In some examples, the plurality of core-shell particles are dispersed in a solution. In some examples, the solution comprises ethylene glycol. In some examples, the plurality of core-shell particles are grafted to a polymer matrix.

In some examples, the core has a size of about 1 μm or less. In some examples, the core has a size of in a range of about 1 μm to about 50 μm. In some examples, the shell has a thickness in a range of about 50 nm to about 100 nm.

Another example embodiment of the present disclosure is directed to die-attach material. The die-attach material includes a plurality of core-shell particles. Each core-shell particle comprising a core and a shell on the core. The core comprises copper and the shell comprises copper nitride. The die-attach material may be an ink or a paste.

In some examples, the plurality of core-shell particles are dispersed in a solution. In some examples, the solution comprises ethylene glycol. In some examples, the plurality of core-shell particles are grafted to a polymer matrix.

In some examples, the core has a size of about 1 μm or less. In some examples, the core has a size of in a range of about 1 μm to about 50 μm. In some examples, the shell has a thickness in a range of about 50 nm to about 100 nm.

In some examples, the die-attach material is lead (Pb) free.

Another example embodiment of the present disclosure is directed to a device. The device includes a semiconductor die comprising a wide band gap semiconductor material. The device includes a substrate. The device includes a die-attach material between the semiconductor die and the substrate. The die-attach material includes a plurality of bonded conductive particles and a metal nitride.

In some examples, the plurality of bonded conductive particles comprise a plurality of bonded copper particles. In some examples, the metal nitride comprises a copper nitride.

In some examples, the substrate comprises a conductive substrate. In some examples, the semiconductor die comprises one or more transistor devices. In some examples, the semiconductor die comprises silicon carbide. In some examples, the semiconductor die comprises a Group III-nitride.

In some examples, the metal nitride is interspersed between the plurality of bonded conductive particles.

In some examples, the substrate comprises a lead frame of a semiconductor package.

In some examples, the device is a discrete power semiconductor package. In some examples, the device is a power module.

Another example embodiment of the present disclosure is directed to a device. The device includes a substrate. The device includes a sintered material on the substrate. The sintered material comprises a plurality of bonded copper particles and a copper nitride.

In some examples, the sintered material forms a die-attach material for the device.

In some examples, the sintered material forms an antenna for the device.

In some examples, the sintered material forms an interconnect for the device.

In some examples, the copper nitride is interspersed between the plurality of bonded copper particles.

Another example embodiment of the present disclosure is directed to a method. The method includes depositing a die-attach material on a substrate, the die-attach material comprising a plurality of core-shell particles, each core-shell particle comprising a core and a shell on the core, wherein the core comprises a conducting material and the shell comprises a metal nitride. The method includes bonding the die-attach material.

In some examples, bonding the die-attach material comprises bonding the die-attach material at a temperature in a range of about 100° C. to about 300° C.

In some examples, bonding the die-attach material comprises bonding the die-attach material for a time period in a range of about 30 minutes to about 120 minutes.

In some examples, bonding the die-attach material comprises bonding the die-attach material at a pressure in a range of about 1 MPa to about 30 MPa.

In some examples, depositing a die-attach material on the substrate comprises depositing the die-attach material by one or more of an inkjet, screen printer, flexo printer, gravure printer, spin coater, blade coater, or spray coater.

In some examples, bonding the die-attach material comprises sintering the die-attach material.

In some examples, bonding the die-attach material comprises bonding the die-attach material with a laser or with pulsed light.

In some examples, bonding the die-attach material forms an antenna or an interconnect on the substrate.

In some examples, bonding the die-attach material attaches a semiconductor die to the substrate.

In some examples, the core comprises copper. In some examples, the metal nitride comprises copper nitride.

In some examples, bonding the die-attach material decomposes the die-attach material into a metal and a nitrogen gas.

Another example embodiment of the present disclosure is directed to a method. The method includes oxidizing a plurality of conductive particles to form a plurality of oxidized conductive particles. The method includes adding the oxidized conductive particles to a solution to form a metal nitride shell on the conductive particles, the solution comprising a compound, the compound comprising hydrogen and nitrogen.

In some examples, the conductive particles comprise copper particles. In some examples, the metal nitride shell comprises copper nitride.

In some examples, the compound is ammonia. In some examples, the compound is urea. In some examples, the solution further comprises methanol.

In some examples, the method further comprises heating the solution with the oxidized conductive particles to produce a plurality of core-shell particles. In some examples, heating the solution comprises heating the solution to a temperature in a range of about 180° C. to about 250° C. In some examples, heating the solution comprises heating the solution for a process period. In some examples, the process period is in a range of about 1 hour to about 6 hours.

In some examples, the method further comprises adding the core-shell particles to a second solution to form an ink or a paste. In some examples, the second solution is ethylene glycol. In some examples, the method includes mixing the core-shell particles with a polymer to form an ink or a paste.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A die-attach material, comprising:

a plurality of core-shell particles, each core-shell particle comprising a core and a shell on the core;

wherein the core comprises a conducting material; and wherein the shell comprises a copper nitride.

2. The die-attach material of claim 1, wherein the metal copper nitride reduces oxidation of the core.

3. The die-attach material of claim 1, wherein the die-attach material is an ink.

4. The die-attach material of claim 1, wherein the die-attach material is a paste.

5. The die-attach material of claim 1, wherein the metal copper nitride decomposes into a metal and a nitrogen gas during bonding of the die-attach material.

6. The die-attach material of claim 1, wherein the conducting material of the core comprises copper.

7. The die-attach material of claim 1, wherein the plurality of core-shell particles are dispersed in a solution.

8. The die-attach material of claim 7, wherein the solution comprises ethylene glycol.

9. The die-attach material of claim 1, wherein the plurality of core-shell particles are grafted to a polymer matrix.

10. The die-attach material of claim 1, wherein the core has a size of about 1 μm or less.

11. The die-attach material of claim 1, wherein the core has a size of in a range of about 1 μm to about 50 μm.

12. The die-attach material of claim 1, wherein the shell has a thickness in a range of about 50 nm to about 100 nm.

13. A die-attach material, comprising:

a plurality of core-shell particles, each core-shell particle comprising a core and a shell on the core;

wherein the core comprises copper and the shell comprises copper nitride; and wherein the die-attach material is an ink or a paste.

14. A device, comprising:

a semiconductor die comprising a wide band gap semiconductor material;

a substrate; and a die-attach material between the semiconductor die and the substrate, the die-attach material comprising a plurality of bonded conductive particles and a metal nitride.

15. The device of claim 14, wherein the plurality of bonded conductive particles comprise a plurality of bonded copper particles.

16. The device of claim 14, wherein the metal nitride comprises a copper nitride.

17. The device of claim 14, wherein the semiconductor die comprises silicon carbide.

18. The device of claim 14, wherein the semiconductor die comprises a Group III-nitride.

19. The device of claim 14, wherein the metal nitride is interspersed between the plurality of bonded conductive particles.

* * * * *